United States Patent
Manes

(10) Patent No.: US 11,384,773 B2
(45) Date of Patent: Jul. 12, 2022

(54) AIR FLOW CONTROL IN DATA STORAGE SYSTEMS

(71) Applicant: Seagate Technology LLC, Cupertino, CA (US)

(72) Inventor: Joseph P. Manes, Arvada, CO (US)

(73) Assignee: Seagate Technology LLC, Fremont, CA (US)

( * ) Notice: Subject to any disclaimer, the term of this patent is extended or adjusted under 35 U.S.C. 154(b) by 271 days.

(21) Appl. No.: 16/742,674

(22) Filed: Jan. 14, 2020

(65) Prior Publication Data

US 2021/0215166 A1 Jul. 15, 2021

(51) Int. Cl.
| | |
|---|---|
| *F04D 29/26* | (2006.01) |
| *H05K 7/20* | (2006.01) |
| *F04D 17/00* | (2006.01) |
| *F04D 29/42* | (2006.01) |
| *F04D 29/44* | (2006.01) |

(52) U.S. Cl.
CPC .......... *F04D 29/263* (2013.01); *F04D 17/00* (2013.01); *F04D 29/4226* (2013.01); *F04D 29/441* (2013.01); *H05K 7/20145* (2013.01); *H05K 7/20172* (2013.01); *H05K 7/20736* (2013.01); *F05D 2250/52* (2013.01)

(58) Field of Classification Search
CPC . F04D 29/4226; F04D 29/441; F05D 2250/52
See application file for complete search history.

(56) References Cited

U.S. PATENT DOCUMENTS

| | | | | |
|---|---|---|---|---|
| 4,476,773 | A * | 10/1984 | Fehr | .................... F04D 29/462 |
| | | | | 415/206 |
| 5,793,610 | A | 8/1998 | Schmitt et al. | |
| 5,921,862 | A | 7/1999 | Ucciardi | |
| 6,005,770 | A | 12/1999 | Schmitt | |
| 6,011,689 | A | 1/2000 | Wrycraft | |
| 6,031,717 | A | 2/2000 | Baddour et al. | |
| 6,073,305 | A * | 6/2000 | Hesskamp | .......... F04D 29/4246 |
| | | | | 415/206 |
| 6,554,698 | B2 | 4/2003 | Kranzdorf et al. | |
| 6,705,833 | B2 | 3/2004 | Tam et al. | |
| 6,837,785 | B2 | 1/2005 | Söderlund | |
| 7,025,086 | B2 | 4/2006 | Maeda et al. | |
| 8,007,228 | B2 | 8/2011 | Wang | |
| 8,057,161 | B2 | 11/2011 | Seidler | |
| 8,215,613 | B2 * | 7/2012 | Cheung | ................... F02D 9/14 |
| | | | | 251/212 |
| 8,414,368 | B2 | 4/2013 | Hansen et al. | |
| 8,851,831 | B2 | 10/2014 | Sun | |
| 8,897,009 | B2 | 11/2014 | Janes et al. | |

(Continued)

FOREIGN PATENT DOCUMENTS

JP 09126191 A 5/1997

*Primary Examiner* — Courtney D Heinle
*Assistant Examiner* — Andrew J Marien
(74) *Attorney, Agent, or Firm* — Faegre Drinker Biddle & Reath LLP

(57) ABSTRACT

A fan assembly includes a radial blower unit configured to exhaust air radially from an inlet axis of the radial blower unit. The fan assembly also includes baffles each partially surrounding the radial blower unit. The baffles are rotatable between an open position and a closed position around respective pivot axes, and the baffles have respective centers of mass aligned with the respective pivot axes.

19 Claims, 11 Drawing Sheets

(56) References Cited

U.S. PATENT DOCUMENTS

| | | |
|---|---|---|
| 9,777,736 B2 | 10/2017 | Shih et al. |
| 10,420,250 B2 | 9/2019 | Fuke et al. |
| 2004/0129410 A1 | 7/2004 | Soderlund |
| 2007/0134110 A1 | 6/2007 | Lin et al. |
| 2008/0056900 A1* | 3/2008 | Seidler ............... H05K 7/20172 416/193 R |
| 2008/0138194 A1* | 6/2008 | Wei ......................... F04D 25/14 415/121.2 |
| 2008/0233861 A1 | 9/2008 | Jenkins et al. |
| 2011/0028081 A1 | 2/2011 | Hopkins et al. |
| 2011/0259550 A1 | 10/2011 | Komaba et al. |
| 2013/0258591 A1 | 10/2013 | Sun et al. |
| 2013/0324025 A1 | 12/2013 | Peng et al. |
| 2017/0042061 A1 | 2/2017 | Chen et al. |
| 2017/0320470 A1* | 11/2017 | Belanger ............... F16K 3/0254 |
| 2020/0355421 A1* | 11/2020 | Fei ......................... F25D 17/045 |

\* cited by examiner

AIR FLOW CONTROL IN DATA STORAGE SYSTEMS

SUMMARY

In certain embodiments, a fan assembly includes a radial blower unit configured to exhaust air radially from an inlet axis of the radial blower unit. The fan assembly also includes baffles each partially surrounding the radial blower unit. The baffles are rotatable between an open position and a closed position around respective pivot axes, and the baffles have respective centers of mass aligned with the respective pivot axes.

In certain embodiments, a system includes a first fan assembly that includes a first radial blower unit configured to exhaust air radially from a first inlet axis of the first radial blower unit. The first fan assembly also includes a first set of baffles rotatable between an open position and a closed position around respective pivot axes such that in the closed position the first set of baffles together completely surround an entire circumference of the first radial blower unit.

In certain embodiments, a method of using a fan assembly is disclosed. The fan assembly includes a radial blower unit with baffles that rotate around a pivot axis between an open position and a closed position. The method includes coupling the fan assembly to a data storage enclosure while the baffles are in the closed position such that the baffles together completely surround an entire circumference of the radial blower unit. The method further includes powering on the radial blower unit to rotate blades such that air is pulled along a rotational axis of the blades and exhausted in a direction radially from the rotational axis to rotate the baffles around respective centers of mass to the open position.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
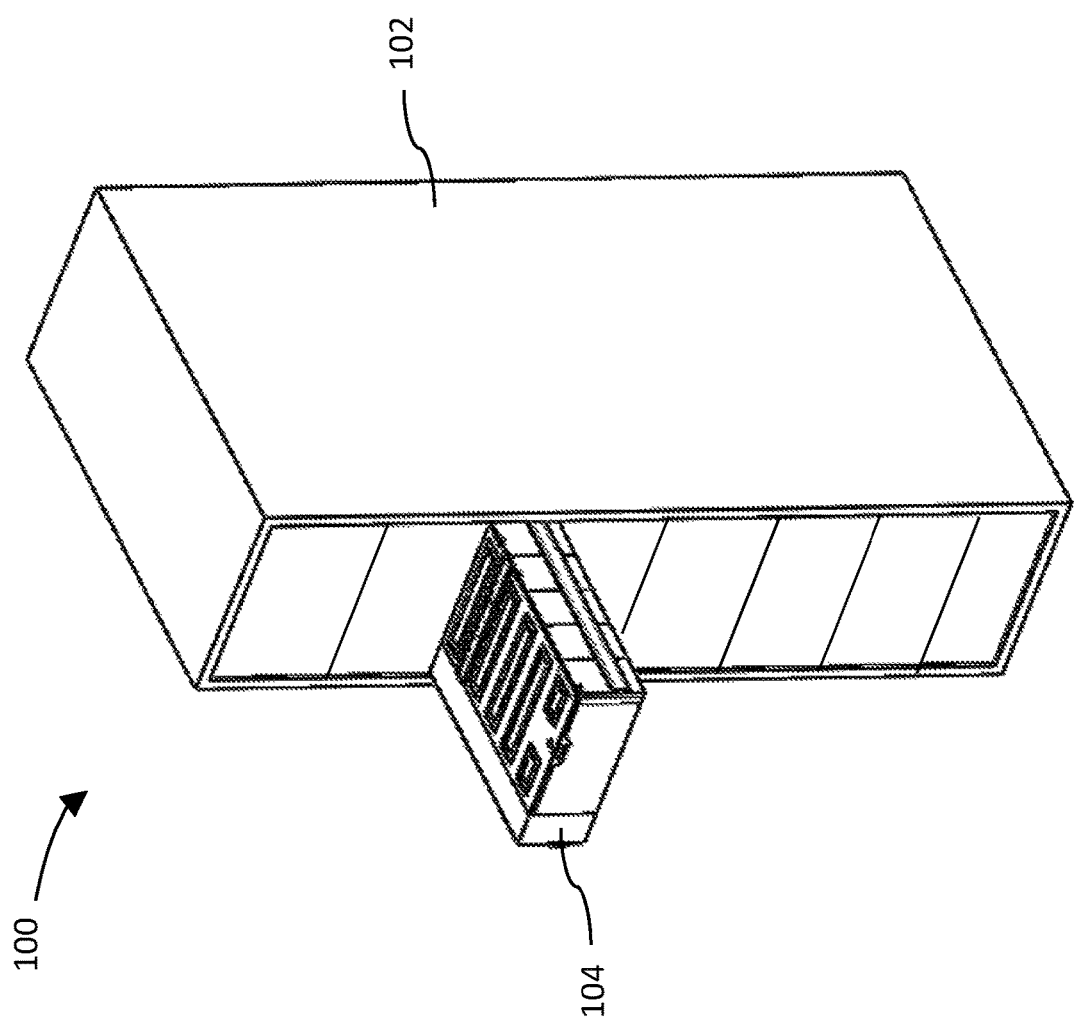
FIG. 1 shows a perspective view of a data storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage systems utilize cooling devices such as air movers (e.g., fans) to keep components of the data storage systems within a desired operating range. When one of the air movers fails, the total volume of air flow is reduced, and the failed air mover exposes an open circuit through which unwanted backflow of air can enter the data storage systems. This open circuit can further reduce the total volume of air flow within the data storage system. Currently, to compensate for the reduced air flow, data storage systems increase the speed at which the still-functioning air movers rotate and/or use motorized mechanisms to close the open circuit. However, these approaches require that the failure be detected (which may require additional components like sensors), require motorized mechanisms, and/or assume that increasing the speed of the other air movers can adequately compensate for the reduced air flow until the failed air mover can be replaced by a functioning air mover. Certain embodiments of the present disclosure are accordingly directed to approaches for helping to prevent backflow of air when radial fan units fail or otherwise malfunction.

FIG. 1 shows a data storage system 100 including a rack 102 (e.g., a cabinet) with a plurality of enclosures 104. Each enclosure 104 can include multiple drawers or storage levels (each of which may be considered separate enclosures or sub-enclosures) that house electronic devices such as data storage devices installed within the drawers or storage levels. Each enclosure 104 itself can be arranged in a drawer-like fashion to slide into and out of the rack 102, although the enclosures 104 are not necessarily arranged as such.

Figure 2:
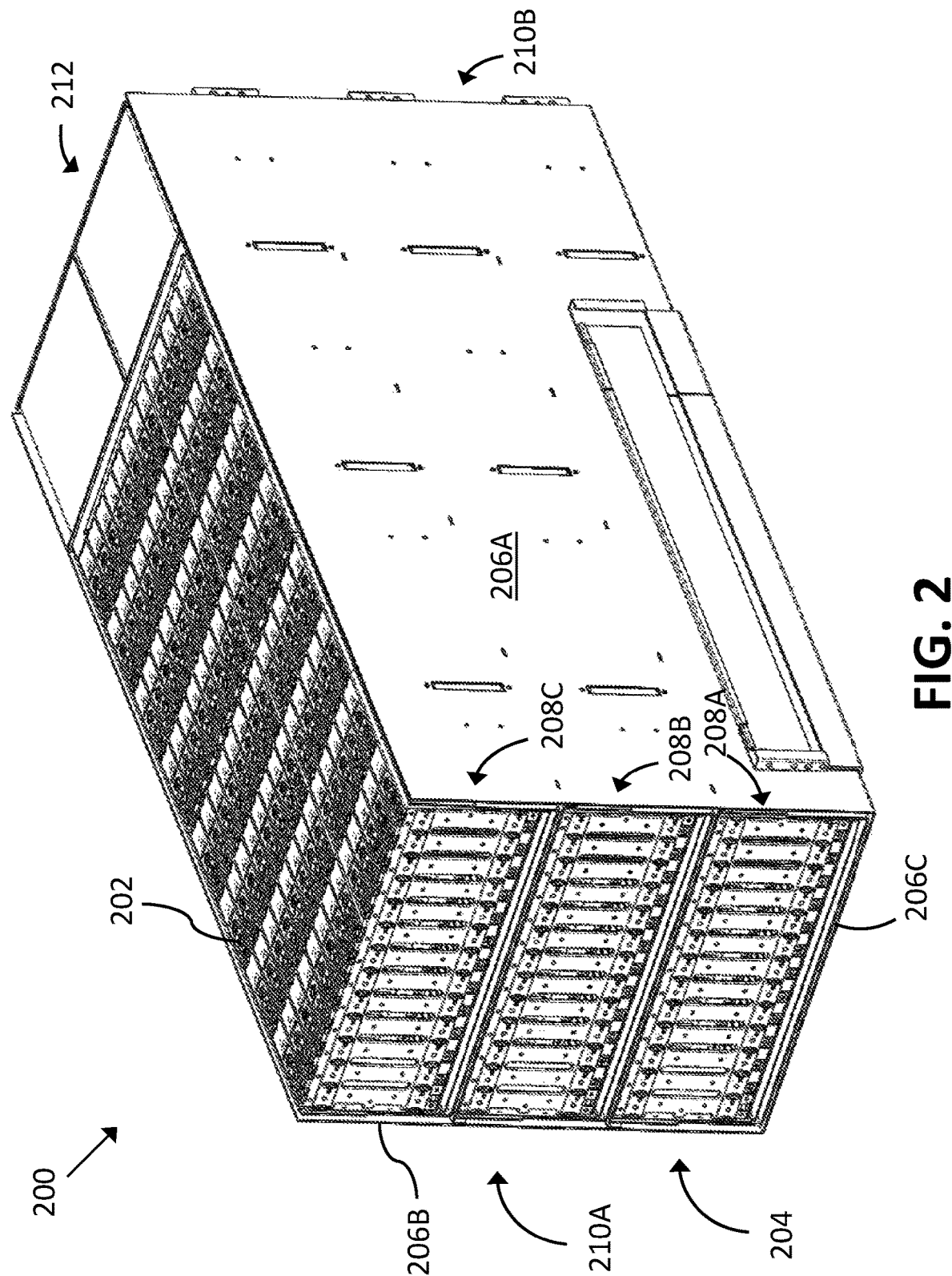
FIG. 2 shows a partially exploded, perspective view of an enclosure, in accordance with certain embodiments of the present disclosure.

FIG. 2 shows an enclosure 200, which can be utilized in a data storage system such as the data storage system 100 of FIG. 1. For example, a rack—such as the rack 102 in FIG. 1—can include multiple individual enclosures, such as the enclosure 200. The enclosure 200 is arranged to secure data storage devices 202 (e.g., hard disk drives and/or solid state drives), various electronics (e.g., power supplies), and cooling devices (e.g., air movers) among other things.

The enclosure 200 includes a chassis 204 with a first side wall 206A, a second side wall 206B, and a bottom wall 206C. The chassis 204 may also include front and rear walls along with a top cover to enclose the data storage devices 202 within the enclosure 200. As shown in FIG. 2, the enclosure 200 can include multiple data storage levels 208A-C each with multiple rows of data storage devices 202. Each data storage level 208A-C may be arranged to slide into and out of the enclosure 200 in a drawer-like fashion. Further, each data storage level 208A-C can form its own enclosure such that the enclosure 200 can be considered to include multiple, smaller enclosures arranged to slide into and out of the enclosure 200.

Figure 3:
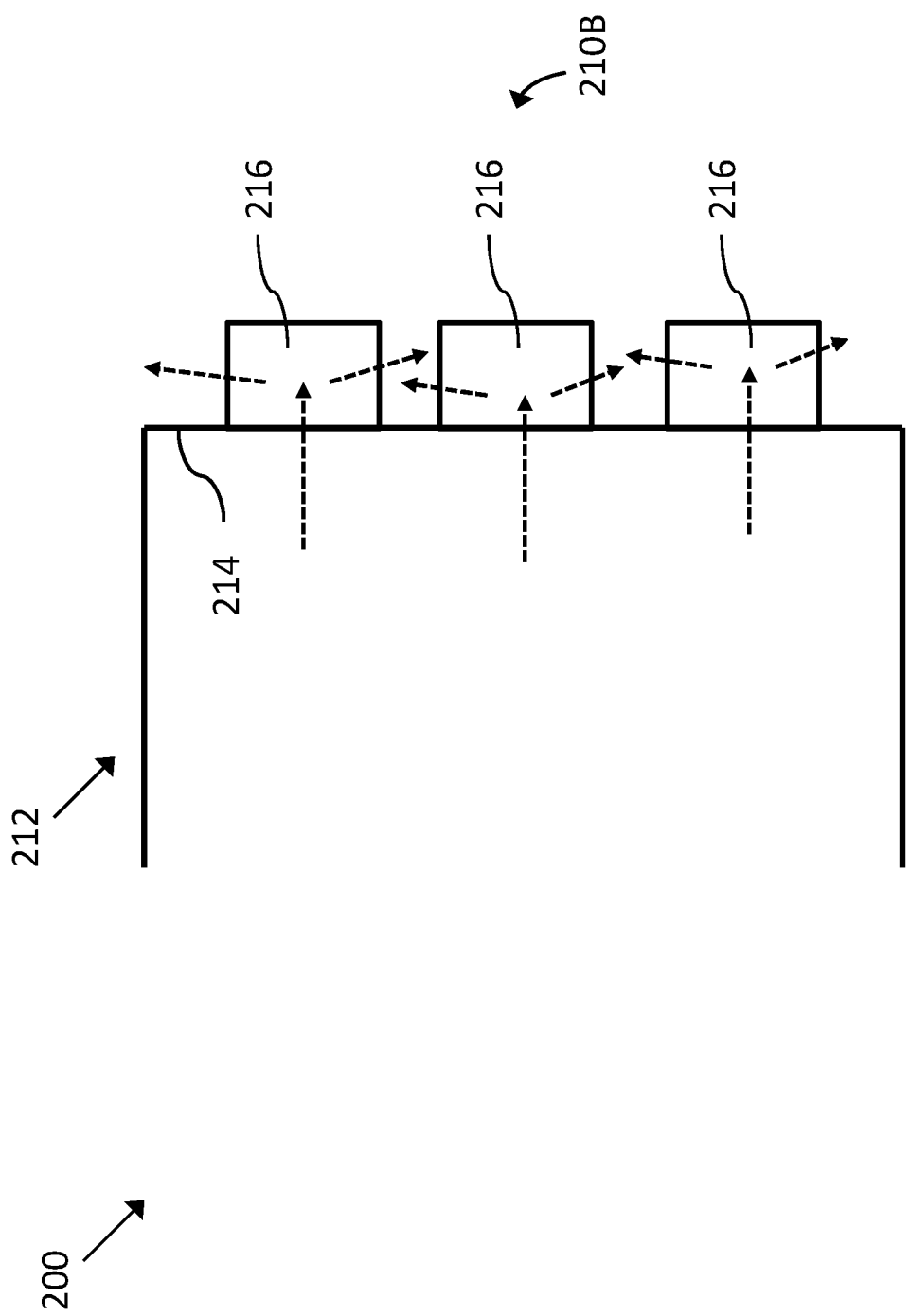
FIG. 3 shows a partial, cutaway view of a back end of the enclosure of FIG. 2, in accordance with certain embodiments of the present disclosure.

The enclosure 200 includes a front end 210A and a back end 210B with a cooling area 212 at the back end 210B of the enclosure 200. FIG. 3 shows a cutaway view of the back end 210B of the enclosure 200. The enclosure 200 includes a back wall 214 on which several fan assemblies 216 are positioned. Exemplary fan assemblies and their various features are shown in FIGS. 4-13 and described in additional detail below. In short, the fan assemblies 216 are arranged to pull air from the front end 210A of the enclosure 200 towards the back end 210B of the enclosure 200. As the air moves within the enclosure 200, the air cools the various electronic devices positioned within the enclosure 200. The fan assemblies 216 shown in FIG. 3 are coupled to the back wall 214 of the enclosure 200 such that all or a majority of each of the fan assemblies 216 is positioned outside the enclosure 200. The dotted arrows in FIG. 3 represent air flowing into the fan assemblies 216 from the interior of the enclosure 200 and exiting the fan assemblies 216 along generally radial directions.

Figure 4:
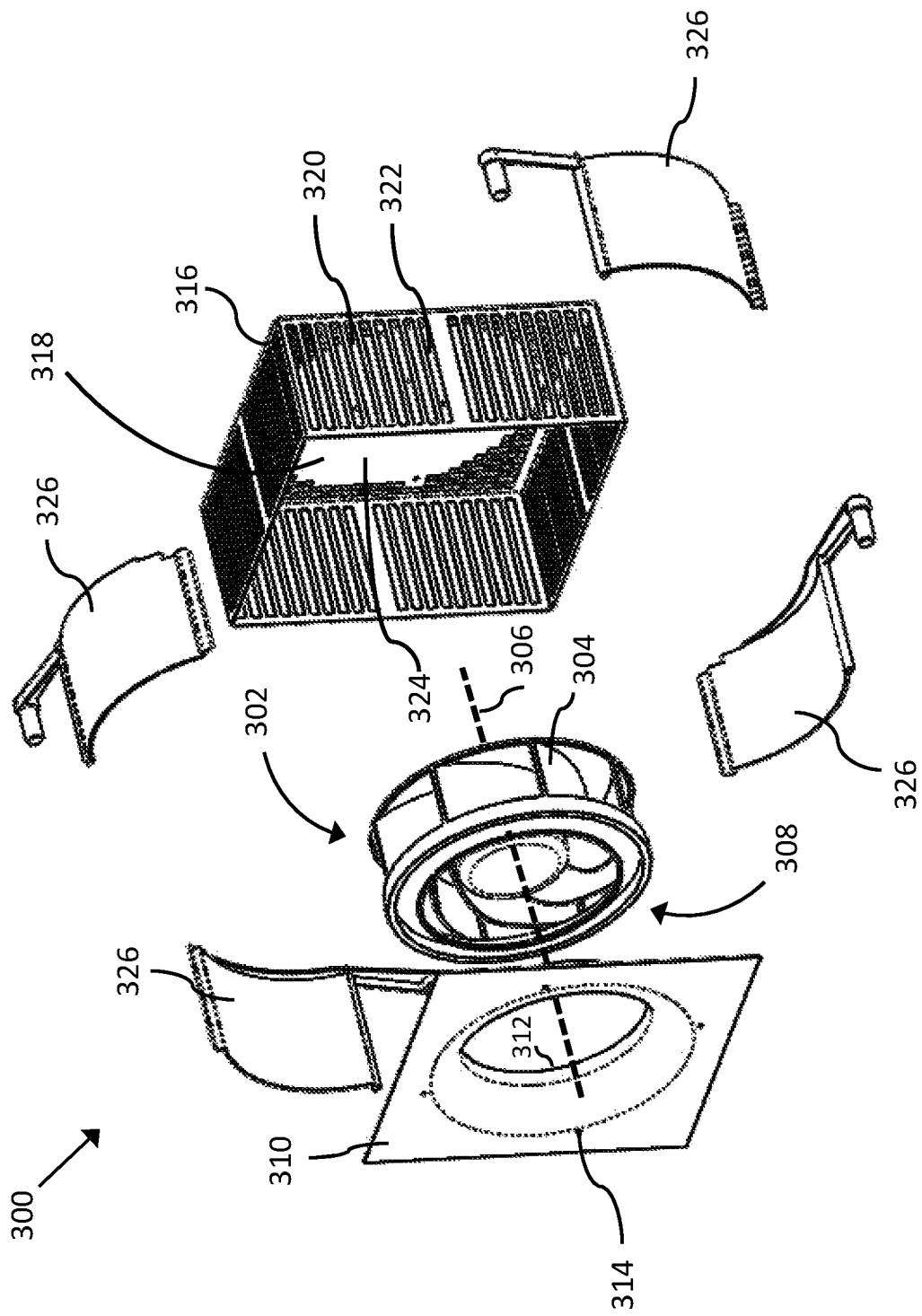
FIG. 4 shows an exploded, perspective view of a fan assembly, in accordance with certain embodiments of the present disclosure.

FIG. 4 shows an exploded view of a fan assembly 300, which can be installed in an enclosure such as the enclosure 104 of FIG. 1 and enclosure 200 of FIGS. 2 and 3.

The fan assembly 300 includes a radial blower unit 302. The radial blower unit 302 includes blades 304 shaped such that—when the blades 304 rotate around a rotation (or inlet) axis 306 (shown in dotted lines in FIG. 4)—the blades 304 pull air through an inlet side 308 of the radial blower unit 302 and exhaust the air radially from the rotation axis 306. As such, when the fan assembly 300 is installed to an enclosure like the fan assemblies 216 of FIG. 3, the air is pulled from inside the enclosure 200 and exhausted in a radial direction outside the enclosure. Radial blower units may be able to exhaust a larger volume of air for a given amount of power compared to axial fans. The radial blower unit 302 can include a motor that is electrically coupled to a power supply in an enclosure and that is coupled to the blades 304 to rotate the blades 304.

The fan assembly 300 includes a front cover 310 that includes an inlet opening 312 and front mounting holes 314. When the fan assembly 300 is assembled, the front cover 310 can be coupled to (e.g., clipped to, fastened to) a back cover 316. The back cover 316 includes a back wall 318 and four side walls 320 with exhaust openings 322 throughout the side walls 320. Although the back cover 316 is shown as including the side walls 320 and exhaust openings 322, the front cover 310 could include side walls and exhaust openings instead of or in addition to those of the back cover 316. Alternatively, a separate component could be coupled between the front cover 310 and the back cover 316 and include exhaust openings, etc. The back cover 316 also includes back mounting holes 324. The radial blower unit 302 can be coupled to the back cover 316 via fasteners that extend through one or more of the back mounting holes 324 and couple to holes in the radial blower unit 302.

The fan assembly 300 also includes baffles 326. In certain embodiments, the fan assembly 300 includes only four baffles 326. Reducing the number of baffles 326 will reduce the number of parts of the fan assembly 300 but may also reduce the total volume of air flow permitted to flow between the baffles 326 and out from the fan assembly 300 (as will be described in more detail below), and vice versa.

Figure 5:
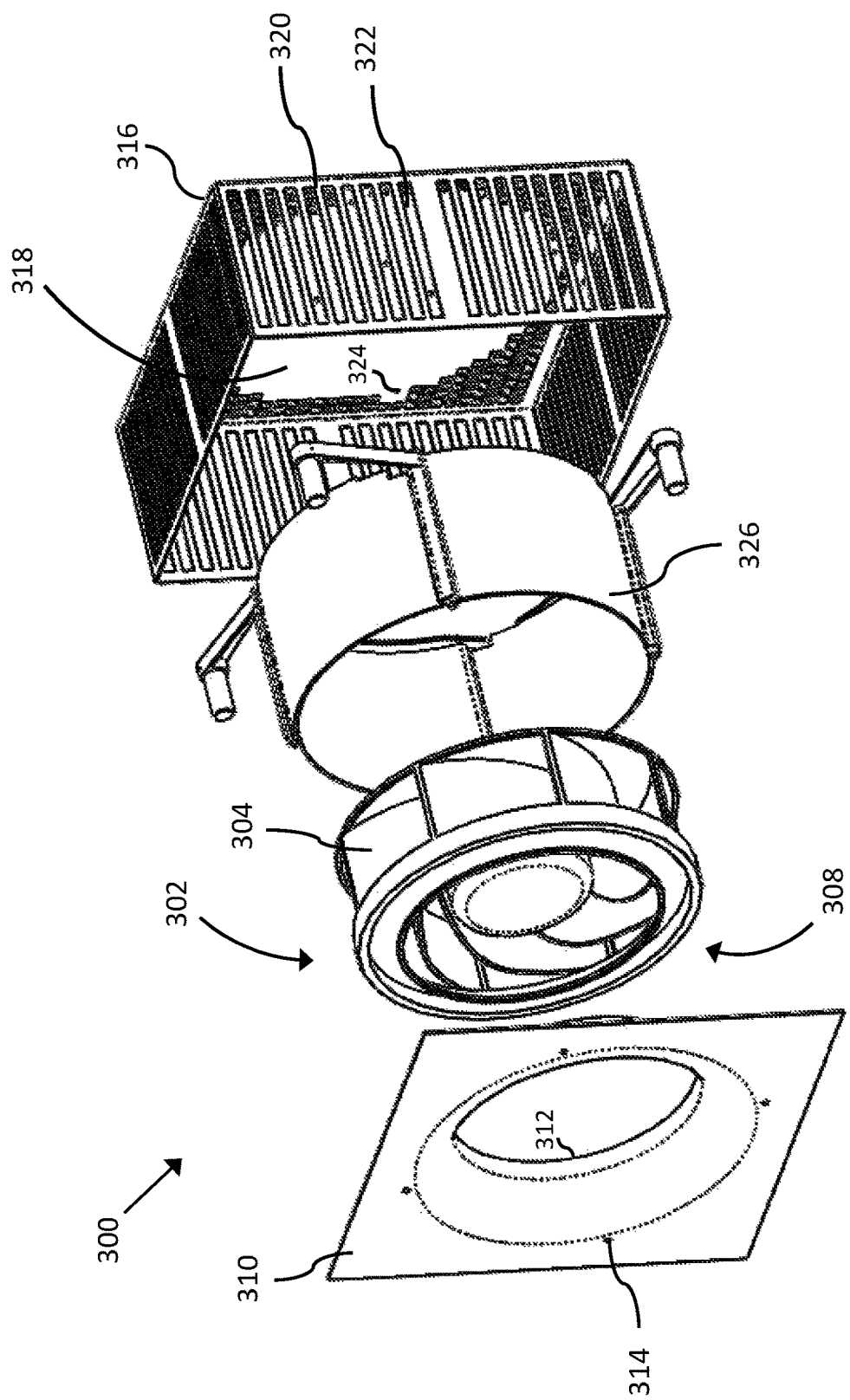
FIG. 5 shows a partially exploded, perspective view of the fan assembly of FIG. 4, in accordance with certain embodiments of the present disclosure.

FIG. 5 shows how the baffles 326 can be positioned with respect to each other when the fan assembly 300 is assembled and in a closed position, which will be described in more detail below. As shown in FIG. 5, in the closed position, the baffles 326 can couple to each other to create a complete cylinder. The radial blower unit 302 can be positioned within the cylinder.

Figure 7:
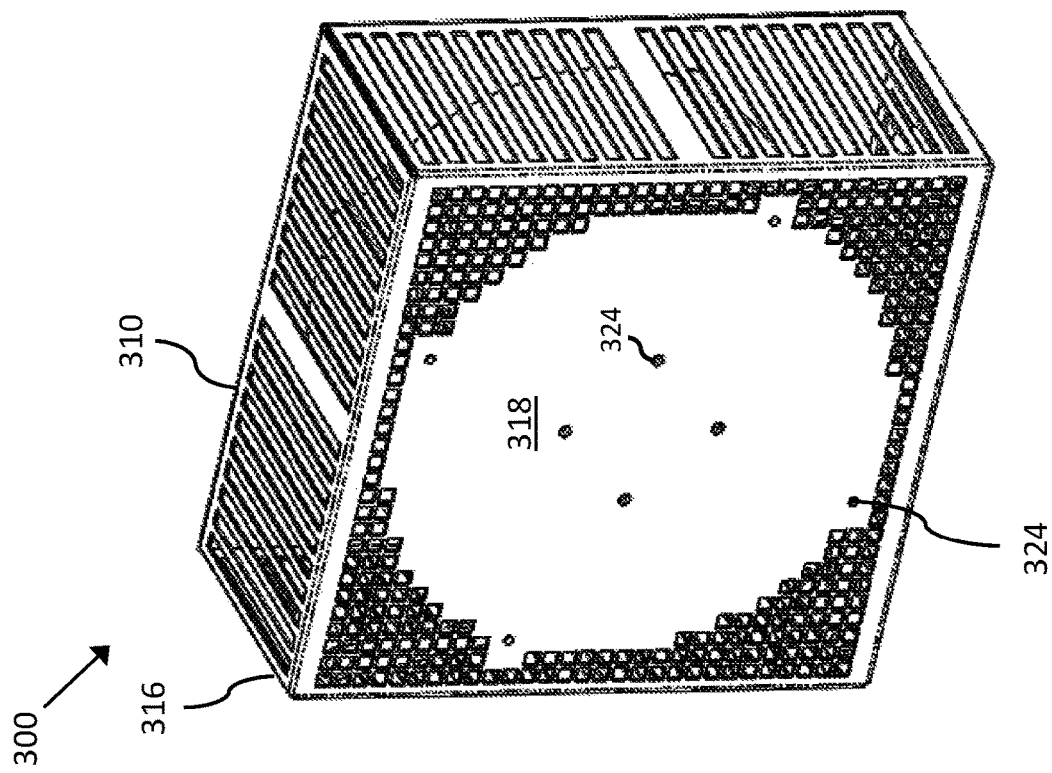
FIG. 7 shows a perspective view of a back side of the fan assembly of FIGS. 4-6, in accordance with certain embodiments of the present disclosure.
Figure 6:
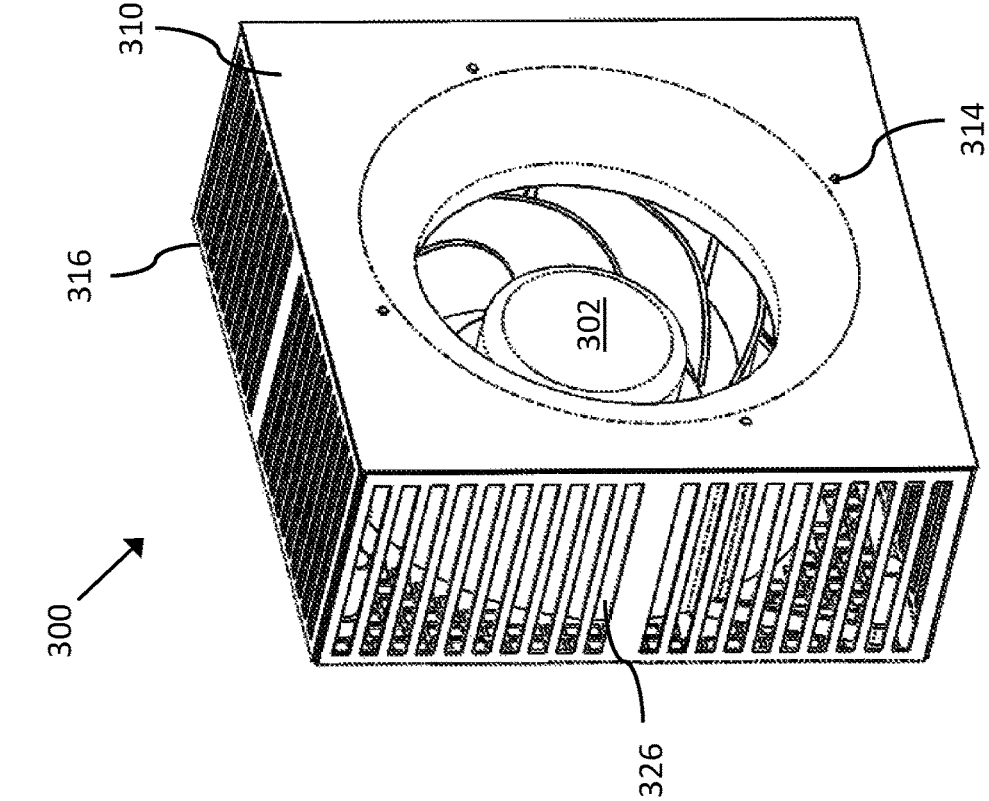
FIG. 6 shows a perspective view of an inlet side of the fan assembly of FIGS. 4 and 5, in accordance with certain embodiments of the present disclosure.

FIGS. 6 and 7 show the fan assembly 300 in its assembled state. As shown, the front cover 310 and the back cover 316 are coupled together and create an internal space, and the radial blower unit 302 and the baffles 326 are positioned within the internal space. When the front cover 310 and the back cover 316 are coupled to each other, the assembled covers may be referred to as a fan cage.

Figure 8:
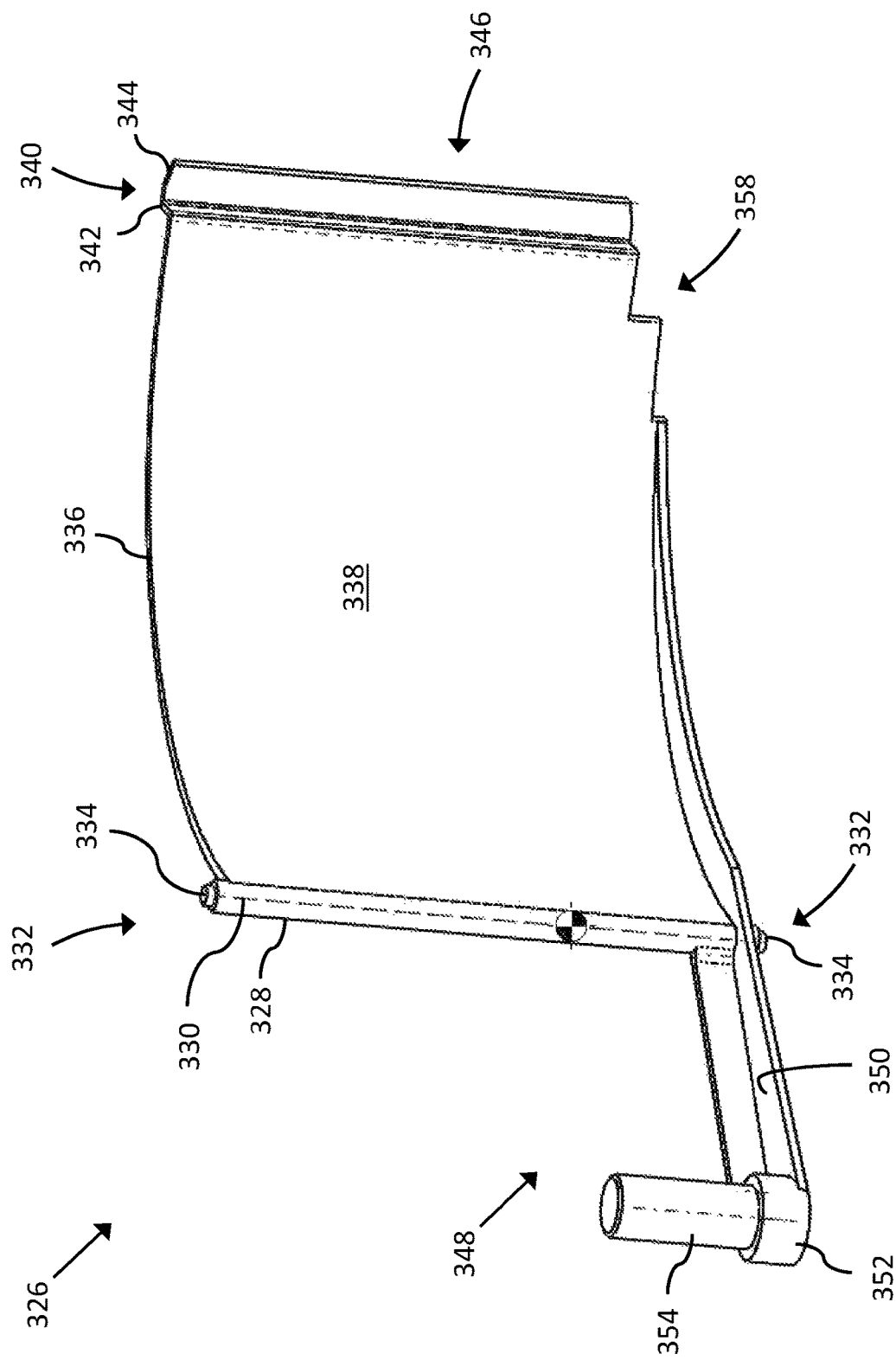
FIG. 8 shows a perspective view of a baffle, in accordance with certain embodiments of the present disclosure.
Figure 9:
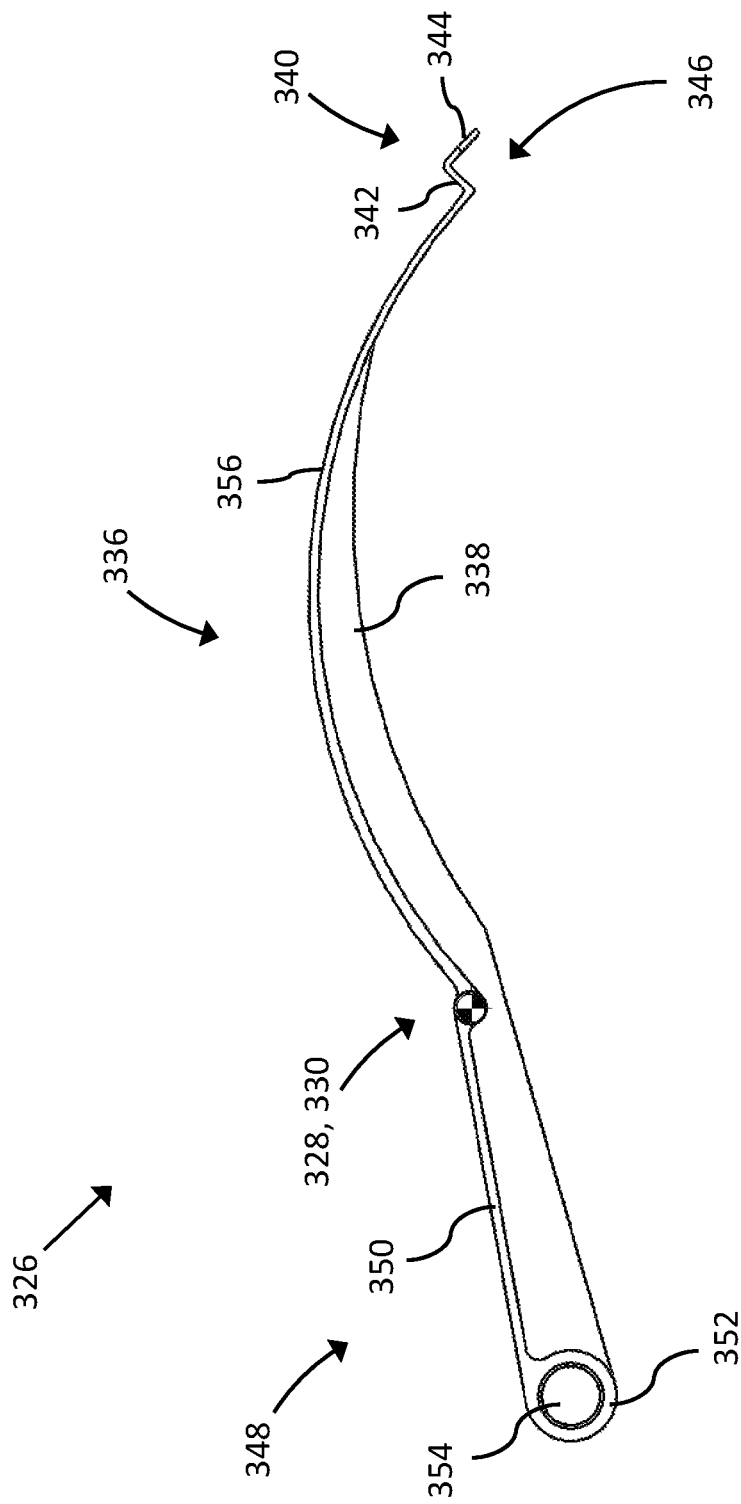
FIG. 9 shows a side view of the baffle of FIG. 8, in accordance with certain embodiments of the present disclosure.

FIGS. 8 and 9 show one of the baffles 326. The baffle 326 includes a shaft 328 that extends along a pivot axis 330 of the baffle 326. At each end 332 of the shaft 328, the shaft 328 includes two protrusions 334 (or short, reduced-size shafts) that are sized to at least partially extend into (or otherwise couple to) respective front mounting holes 314 and back mounting holes 324 of the front cover 310 and the back cover 316. When the fan assembly 300 is assembled, the shaft 328 extends between the front cover 310 and the back cover 316 and is arranged to be able to rotate around the pivot axis 330.

Figure 13:
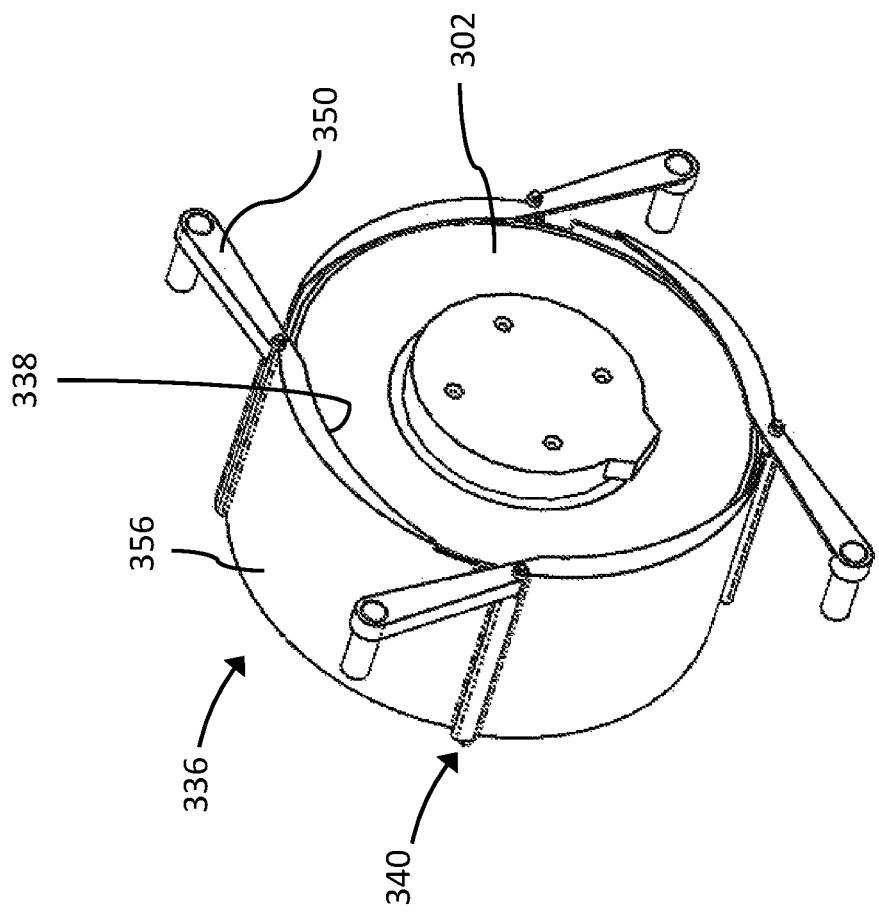
FIG. 13 shows a perspective view of a portion of the fan assembly of FIGS. 4-7 and 10-12 in a closed position, in accordance with certain embodiments of the present disclosure.
Figure 12:
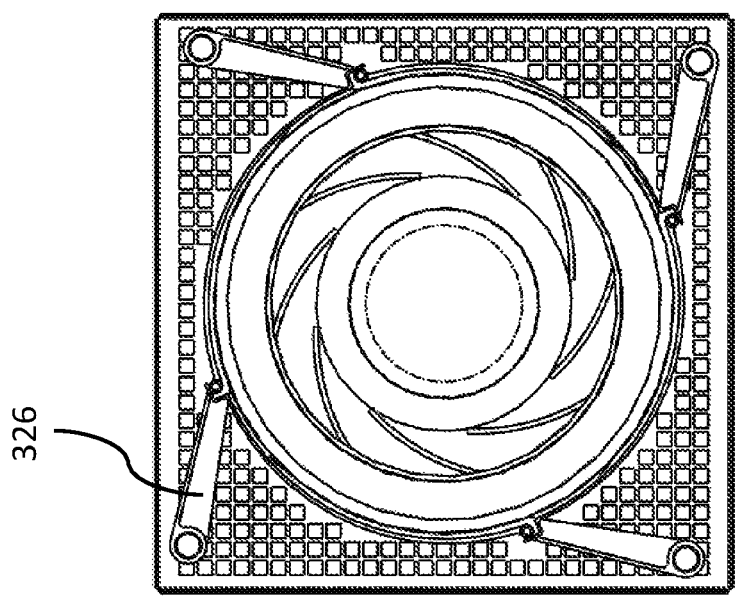
FIG. 12 shows a front view of the fan assembly of FIGS. 4-7, 10, and 11 in a closed position, in accordance with certain embodiments of the present disclosure.

The baffle 326 includes a wing 336 that extends from the shaft 328. The wing 336 includes a wind-directing surface 338 that is shaped (e.g., curved) such that the wind-directing surface 338 directs or otherwise guides air that impinges on the wind-directing surface 338. The wing 336 also includes an L-shaped portion 340 with a first leg 342 and a second leg 344 at a distal end 346 of the wing 336. When the fan assembly 300 is assembled and in the closed position (as shown in FIGS. 12 and 13), at least one of the legs 342, 344 of the L-shaped portion 340 overlaps at least a portion (e.g., shaft 328) of another baffle 326 to help to completely surround the radial blower unit 302 in the closed position.

The baffle 326 also includes a counterweight portion 348 that extends from an opposite side of the shaft 328 (and pivot axis 330) and the wing 336. As shown in FIGS. 8 and 9, the counterweight portion 348 includes an arm 350, a coupler 352, and a counterweight 354 that is attached to (or integrally formed with) the baffle at the coupler 352. In certain embodiments, the baffle 326 comprises a polymer-based material (e.g., a plastic material) and is formed by a mold process. In certain embodiments, the counterweight 354 is a separate component (e.g., a pin) comprising metal (e.g., steel) that is coupled to the rest of the baffle 326. Put another way, in certain embodiments, except for the counterweight 354, the rest of the baffle 326 is single components of molded plastic. In certain embodiments, the counterweight 354 is embedded (e.g., completely embedded) in the material of the rest of the baffle 326. In other embodiments, the counterweight 354 is the same material as the rest of the baffle 326. If the counterweight 354 was the same material of the baffle 326 design shown in FIG. 8, the counterweight 354 would be larger in size (e.g., longer, larger diameter) for additional mass and/or be positioned farther away from the pivot axis 330.

The position of the counterweight 354 (e.g., the length of the arm 350 and position of the coupler 352) and the mass of the counterweight 354 are designed such that a center of mass of the baffle 326 is aligned with the pivot axis 330. As such, the baffles 326 can be said to be balanced along the shaft 328 and pivot axis 330. As will be described in more detail below, the baffles 326 can rotate between respective open positions and closed positions around respective pivot axes 330. In certain embodiments, the respective pivot axes 330 are parallel to the inlet axis 306 of the radial blower unit 302.

With the center of mass of the baffles 326 aligned with the pivot axis 330 of the baffles 326, whether the baffles 326 are in the closed position or the open position is dependent on the direction of air flow through the radial blower unit 302. With the baffles 326 balanced about the pivot axis 330, the amount of air flow required to rotate the baffles 326 from the closed position to the open position or vice versa is low. As such, the radial blower unit 302 can operate more efficiently compared to designs requiring additional force to open the baffles 326 and maintain the baffles 326 in the open position.

Figure 11:
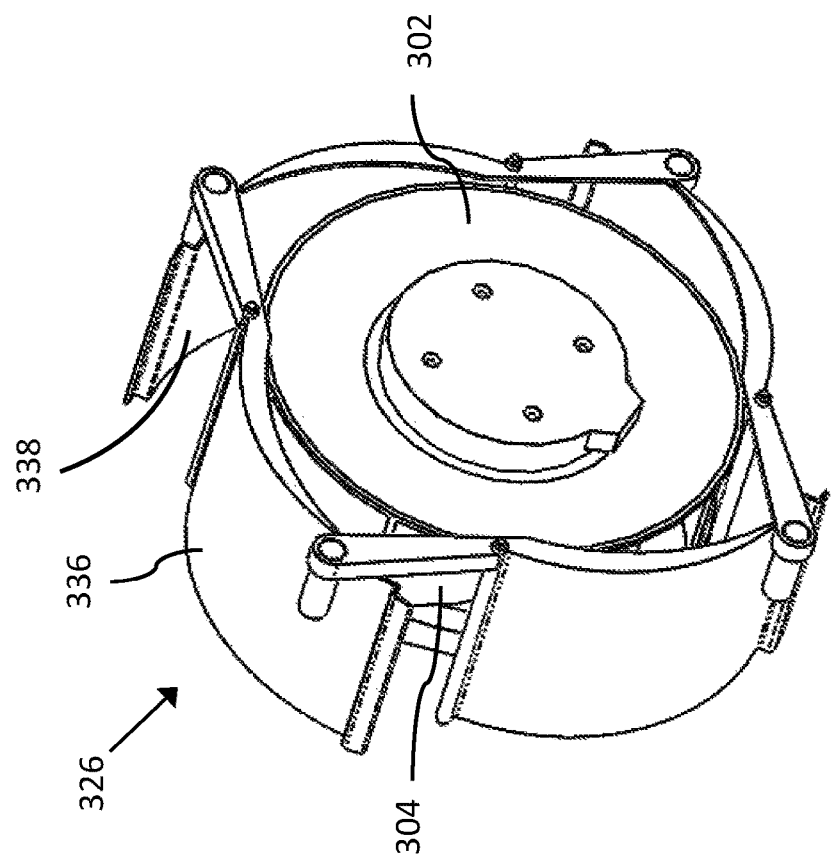
FIG. 11 shows a perspective view of a portion of the fan assembly of FIGS. 4-7 and 10 in an open position, in accordance with certain embodiments of the present disclosure.
Figure 10:
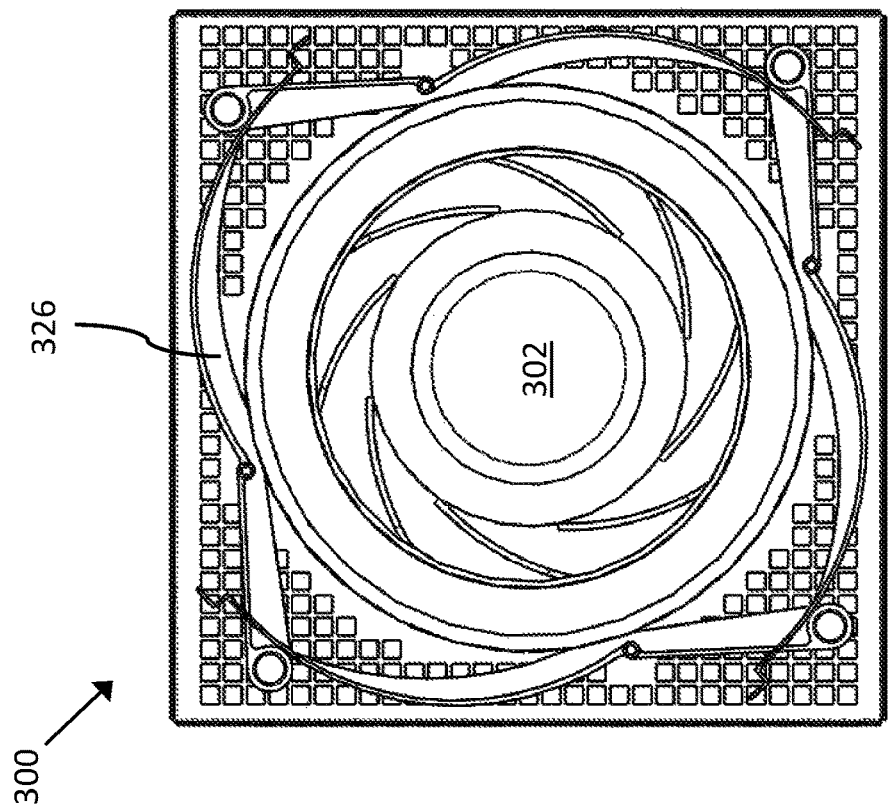
FIG. 10 shows a front view of the fan assembly of FIGS. 4-7 in an open position, in accordance with certain embodiments of the present disclosure.

FIGS. 10 and 11 show the baffles 326 in the open position. When the radial blower unit 302 is operating properly, the blades 304 of the radial blower unit 302 rotate and pull air through the inlet side 308 of the radial blower unit 302 and exhaust the air radially from the rotation axis 306. The exhausted air will impinge on the wings 336 of the baffles 326 and cause the baffles 326 to rotate around their respective pivot axes 330 (as shown in FIGS. 8 and 9) to the open position. In the open position, the exhausted air can pass through gaps between the opened baffles 326 and/or impinge the wings 336 of the baffles 326 and be guided through the gaps by the wind-directing surfaces 338. As noted above, the size of the gaps between the opened baffles 326 will affect the total volume of air that can be exhausted from the fan assembly 300.

In certain embodiments, such as that shown in FIGS. 10 and 11, the baffles 326 rotate from the closed position to the open position until the baffles 326 contact an adjacent baffle 326. For example, in the most open position, the wing 336 of one baffle 326 may contact the counterweight 354 (or another part of the counterweight portion 348) of another adjacent baffle 326 such that the wing 336 of the baffle 326 cannot rotate (or open) further. As such, adjacent baffles 326 can limit the extent other baffles 326 can open. As shown in FIG. 8, the wing 336 may include cutout portions 358 so that the wing 336 contacts the counterweight 354 but not the other parts of the counterweight portion 348 as the wing 336 rotates to the open position. In other embodiments, the baffles 326 may open until the wing 336 or the counterweight portion 348 contacts the back cover 316.

FIGS. 12 and 13 show the baffles 326 in the closed position. As noted above, when one of the radial blower units 302 fails, air may pass through the radial blower unit 302 in a reverse direction (e.g., radially into the blades 304 and exhausted out the inlet side 308 of the radial blower unit 302). However, the baffles 326 can block the reverse flow of air. When the radial blower unit 302 has failed, the reverse flow of air impinges on the surfaces 356 of the wings 336 that is opposite of the wind-directing surfaces 338. The reverse flow of air causes the baffles 326 to rotate to the closed position. In certain embodiments, in the closed position, the baffles 326 together completely surround an entire outer circumference of the radial blower unit 302 (e.g., surround 360 degrees of the radial blower unit 302) as shown in FIGS. 12 and 13. In certain embodiments, in the closed position, the baffles 326 together cover tips of the blades 304 of the radial blower unit 302. As noted above, in the closed position, portions of the baffles 326 (e.g., the L-shaped portion 340) overlaps with or covers at least a portion of at least one other baffle 326 (e.g., the shaft 328). As such, together, the baffles 326 can be considered to encircle or completely cover the outer circumference of the radial blower unit 302.

The fan assembly 300 shown in the figures and described above provides approaches for limiting the back flow of air through the fan assembly 300 in the event the radial blower unit 302 fails or misfunctions. The fan assemblies 300 can include baffles 326 that are balanced (e.g., with a center of mass aligned along the baffles' center of rotation) such that the baffles 326 can open or close based on the flow of air impinging on the baffles 326 (e.g., positive or negative flow). While the disclosure illustrates the cooling of a data storage enclosure, in other embodiments the fan assembly 300 may be used to other types of enclosures such as enclosures that feature electronics other than data storage devices (e.g., processors, power supply units).

Figure 14:
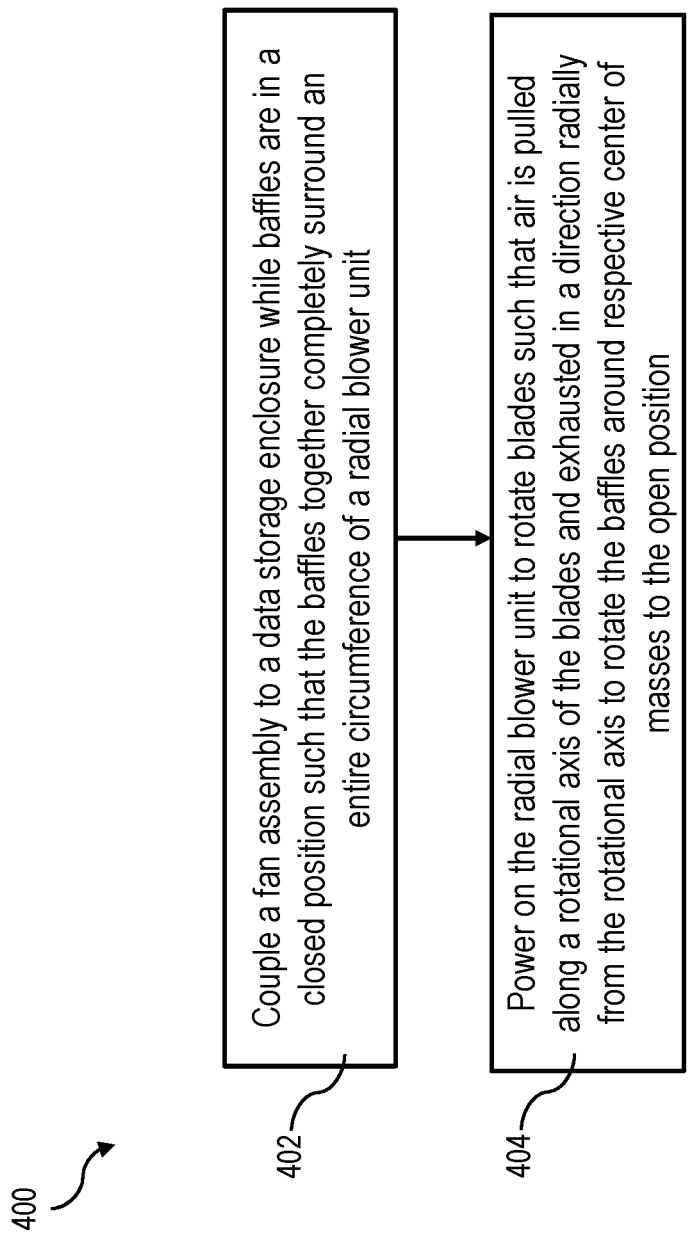
FIG. 14 shows a block diagram of steps of a method, in accordance with certain embodiments of the present disclosure.

FIG. 14 shows a block diagram of a method 400 for using the fan assembly 300 described above. The method 400 includes coupling the fan assembly 300 to the data storage enclosure 200 while the baffles 326 are in the closed position such that the baffles 326 together completely surround an entire circumference of the radial blower unit 302 (block 402 in FIG. 14). The method 400 also includes powering on the radial blower unit 302 to rotate the blades 304 such that air is pulled along the rotation axis 306 of the blades 304 and exhausted in a direction radially from the rotation axis 306 to rotate the baffles 326 around respective center of masses to the open position (block 404 in FIG. 14).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

I claim:

1. A fan assembly comprising:
   a radial blower unit configured to exhaust air radially from an inlet axis of the radial blower unit; and
   baffles each partially surrounding the radial blower unit, the baffles rotatable between an open position and a closed position around respective pivot axes, the baffles having respective centers of mass aligned with the respective pivot axes.

2. The fan assembly of claim 1, wherein the fan assembly includes only four baffles.

3. The fan assembly of claim 1, wherein the baffles each include a wing with a wind-directing surface.

4. The fan assembly of claim 3, wherein the baffles each include a counterweight.

5. The fan assembly of claim 4, wherein the counterweight is positioned on an opposite side of the respective pivot axes than the wing.

6. The fan assembly of claim 1, wherein in the closed position, each baffle overlaps at least a portion of at least one other baffle.

7. The fan assembly of claim 1, wherein the baffles each include a respective shaft that extends along the pivot axis.

8. The fan assembly of claim 1, further comprising:
a front cover coupled to a back cover, wherein the respective shafts are coupled between the front cover and the back cover.

9. The fan assembly of claim 8, wherein end portions of the respective shafts at least partially extend into holes in the front cover and the back cover.

10. The fan assembly of claim 1, wherein the radial blower unit includes blades with blade tips that are covered by the baffles in the closed position.

11. The fan assembly of claim 1, wherein in the closed position, together the baffles completely surround a circumference of the radial blower unit.

12. The fan assembly of claim 1, wherein the respective pivot axes are parallel to the inlet axis of the radial blower unit.

13. A system comprising:
a first fan assembly including:
a first radial blower unit configured to exhaust air radially from a first inlet axis of the first radial blower unit; and
a first set of baffles rotatable between an open position and a closed position around respective pivot axes such that in the closed position the first set of baffles together completely surround an entire circumference of the first radial blower unit.

14. The system of claim 13, wherein the first set of baffles each have respective centers of mass aligned with the respective pivot axes.

15. The system of claim 13, wherein the first radial blower unit includes blades with blade tips that are covered by the first set of baffles in the closed position.

16. The system of claim 13, wherein the first set of baffles each include a wing and a counterweight on each side of the respective pivot axes, wherein the wings together completely surround the entire circumference of the first radial blower unit.

17. The system of claim 13, further comprising:
an enclosure, wherein the first fan assembly and a second fan assembly are coupled to the enclosure, the second fan assembly including:
a second radial blower unit configured to exhaust air radially from a second inlet axis of the second radial blower unit, and
a second set of baffles rotatable between an open position and a closed position around the respective pivot axes such that in the closed position the second set of baffles together completely surround an entire circumference of the second radial blower unit.

18. The system of claim 17, wherein the first fan assembly and the second fan assembly are attached to a back wall of the enclosure.

19. The system of claim 17, wherein the first fan assembly and the second fan assembly are positioned outside the enclosure.

* * * * *